United States Patent [19]

Froeliger

[11] Patent Number: 4,495,651
[45] Date of Patent: Jan. 22, 1985

[54] BROADCAST RECEIVER COMPRISING AN ENTIRELY ELECTRONIC CONTROL DEVICE

[75] Inventor: Denis Froeliger, Paris, France

[73] Assignee: Societe d'Electronique Industrielle d'Elbeuf-Elindel, Paris, France

[21] Appl. No.: 446,891

[22] Filed: Dec. 6, 1982

[30] Foreign Application Priority Data

Dec. 9, 1981 [FR] France ............................ 81 23029

[51] Int. Cl.³ .......................... H04B 1/08; H04B 1/16
[52] U.S. Cl. .................................... 455/158; 334/15; 340/365 C; 340/712; 455/159; 455/168; 455/234; 455/347
[58] Field of Search ........................... 455/345–347, 455/90, 158, 170, 177, 179, 161, 168; 334/15, 85; 340/365 C, 365 VL, 712, 716, 815.2; 200/DIG. 1

[56] References Cited

U.S. PATENT DOCUMENTS

| 1,825,070 | 9/1931 | Kayser | 455/347 |
| 3,503,018 | 3/1970 | Cavanagh | 334/15 |
| 3,757,260 | 9/1973 | Fujita | 334/15 |
| 3,958,239 | 5/1976 | Green | 340/365 C |
| 3,965,336 | 6/1976 | Grohmann | |
| 4,421,418 | 12/1983 | Morishima | 340/712 |

FOREIGN PATENT DOCUMENTS

| 1303409 | 11/1971 | Fed. Rep. of Germany . |
| 2036840 | 6/1972 | Fed. Rep. of Germany . |
| 2355413 | 4/1980 | France . |
| 158740 | 4/1981 | United Kingdom . |

OTHER PUBLICATIONS

Funkschau, vol. 49, No. 22, Oct., 1977, Munich, Germany, Auto-und Reiseempfanger: "Die Kleinen" mausern sich, pp. 1020–1024.
Nachrichten Elektronik, vol. 31, No. 11, Nov., 1977, Berlin, Germany, G. Dickopp: "Entwicklungstendenzen in der Horrundfunk-Empfangstechnik," pp. 313–315.
IEEE Transactions on Broadcast and Television Receivers, vol. BTR 20, No. 4, Nov., 1974, G. Whelpley: "Solid State Audio Control," pp. 299–310.

Primary Examiner—Marc E. Bookbinder
Attorney, Agent, or Firm—Pollock, Vande Sande & Priddy

[57] ABSTRACT

A broadcast receiver is provided for mounting on board a motor vehicle, whose control circuit is entirely electronic. The receiver comprises a case whose front face, accessible to the user, is free from unevennesses or appreciable projections and which presents an opaque appearance when the receiver is stopped. The front wall is formed by a plate made from a tinted transparent plastic material. It comprises four sensitive zones which are formed by metallizations on the rear face of the plate so as to form capacitive proximity sensor keys. The indication of the wave range is effected by selective illumination of zones comprising graduations and/or by means of a double seven-segment display.

21 Claims, 3 Drawing Figures

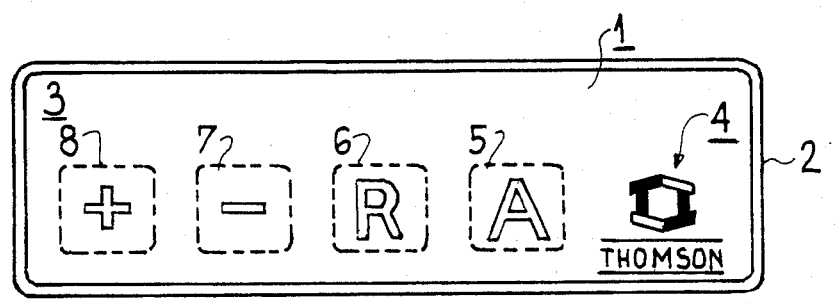
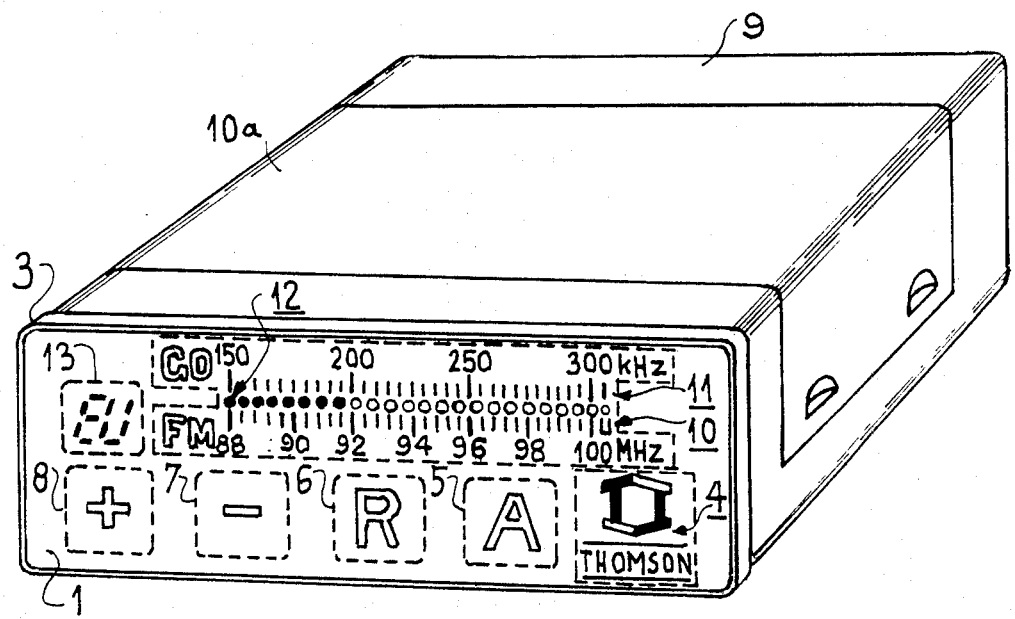

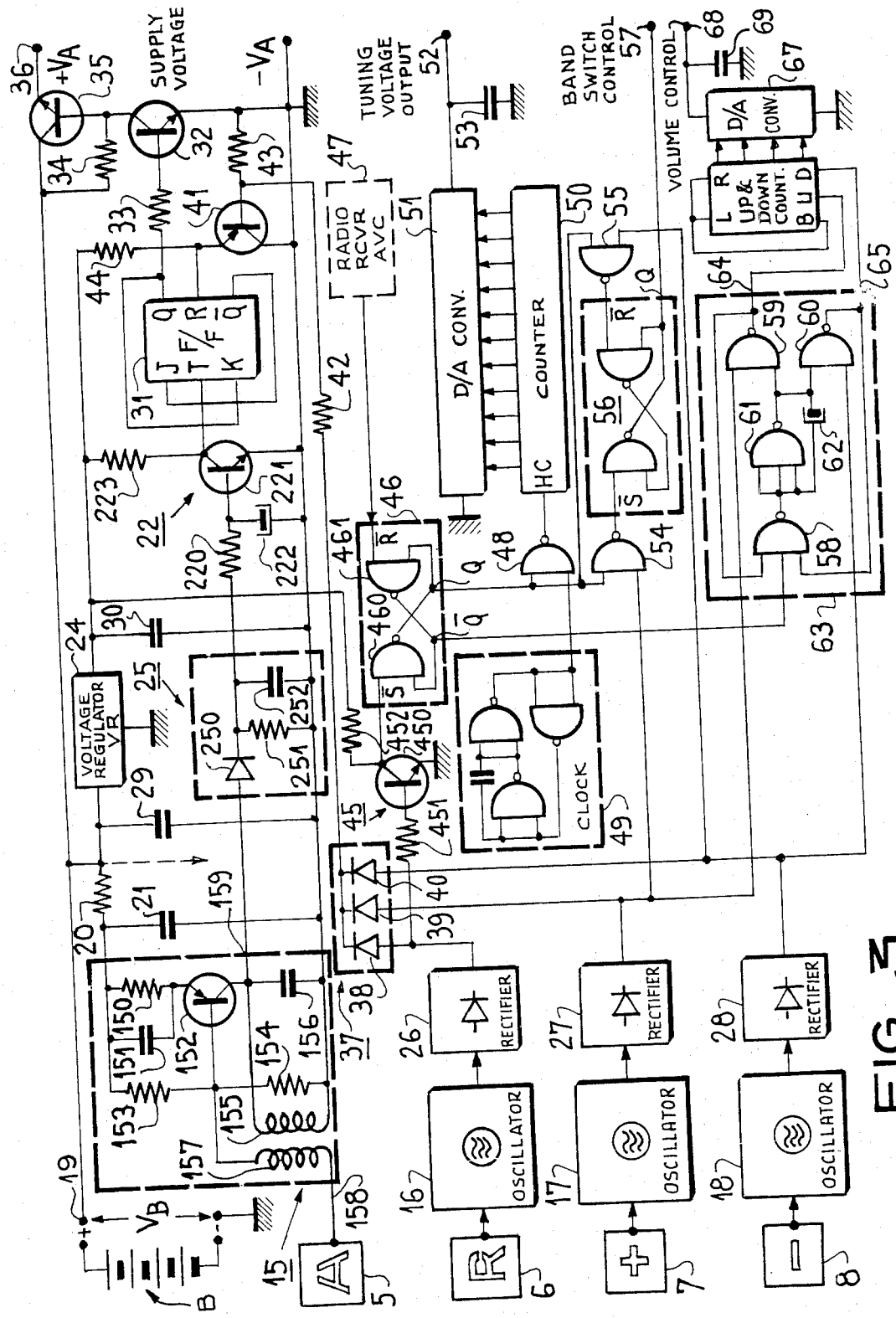
FIG_3

BROADCAST RECEIVER COMPRISING AN ENTIRELY ELECTRONIC CONTROL DEVICE

BACKGROUND OF THE INVENTION

The present invention relates to broadcast receivers, that is to say receivers of broadcast electromagnetic waves modulated in amplitude or in frequency on emission by a sound or audio-frequency signal, and more especially to the arrangement of their control devices. It relates, more particularly, to so-called "radio" receivers and especially those intended to fitted to motor vehicles, called "car radios" and to the control devices thereof, free from any mechanical component.

In conventional "radio" and "car radio" receivers, the control devices comprise, more especially, an "on-off" switch which is either coupled to the shaft controlling the volume control potentiometer, which must be rotated, or controlled by a push-button, a volume control potentiometer with rotary or rectilinear translation shaft, a reactive element for tuning the resonant radio-frequency circuits and the local oscillator comprising several simultaneously variable reactances, such as multiple tuning capacitors, fixed to the same shaft or inductances with axial mobile cores and mechanically coupled control, and rotary wave range switches with push-buttons or keys. All these elements, as well as the tuning indicator with its dial, generally have a mechanical control and those with rotary shafts are manipulated by the user by means of rotary knobs which extend from the front face turned towards him.

Mechanical control elements such as volume or tuning voltage regulating potentiometers, when the variable reactance elements are formed by diodes ("varicap") whose capacity is variable as a function of their reverse biasing voltage, and multiple rotary capacitors or the mobile core coils are sources of mechanical and/or electrical (false contact) breakdowns and are subject to wear.

In so far as the receivers are concerned which are intended to be mounted on board motor vehicles so as to be accessible to the driver, whose case may be inserted in an opening formed in the dashboard, for example, the projecting parts which extend from the front face or facade of the receiver, such as rotary control knobs, are likely to cause injuries to the driver and/or passengers of the vehicle, particularly during sudden decelerations of this latter. Moreover, rotary control knobs, push-buttons and station indicators make the presence of a conventional car radio easily detectable by possible thieves.

The invention remedies the above-mentioned drawbacks by replacing the mechanical control and indication elements by static, entirely electronic, elements.

The invention provides a broadcast receiver with control devices entirely free of mechanical elements.

SUMMARY OF THE INVENTION

According to the invention, the control device of this receiver is adapted so that the front face or facade thereof accessible to the user is free of appreciable projections or unevennesses. When the receiver is inoperative, this front face presents a substantially smooth and opaque appearance.

To this end, the front face comprises a plate of predetermined thickness, made from a transparent insulating material which is tinted, so as to ensure the opacity thereof when the receiver is inoperative and so as to attenuate the light from the indicator lamps which light it up from inside, when the receiver has been switched on. On its face turned towards the inside of the case of the receiver, the plate comprises several so-called sensitive zones, covered respectively with layers of a conducting material and insulated from each other so as to form respectively control contacts by capacitive proximity effect, which are actuated by bringing a part of the body of the user close thereto, such for example as a hand or a finger, and which are known per se.

In one embodiment of the invention, the conducting layer of each key is connected to one of the terminals of the reaction winding of a transistor oscillator whose collector is connected to a parallel resonant circuit and which begins to oscillate when a part of the body of the user is capacitively coupled to this layer.

The wave delivered by the oscillator is transmitted through a rectifying circuit to at least one flip-flop so that, for example, the transition corresponding to the starting up of the oscillator controls the switching thereof to a predetermined state on condition that is was previously in a state complementary to this latter. For certain keys, the rectangular signal delivered by the rectifier during oscillation of the oscillator, due to the prolonged presence of a finger of the user in the vicinity thereof is applied to at least one coincidence logic gate (of the "AND" or "NAND" type) either to let through recurrent pulses from an incorporated clock, or to close a feedback loop of an astable multivibrator generating other recurrent pulses, during the duration of this signal.

In another embodiment of the invention, in which the tunable resonant circuits of the receiver (equipping the radio-frequency input stage, the mixer and the local oscillator) comprise variable capacity diodes, the tuning voltages of these diodes are provided by an automatic search device comprising a clock delivering recurrent rectangular signals, another coincidence gate controlled by another flip-flop whose switching to a state enabling the gate is controlled by one of the keys and whose switching from this state to its complementary state, controlling disabling of the gate, is controlled by a pulse or transition from the receiver circuit, indicating the reception of a carrier wave of an amplitude greater than a predetermined threshold, a binary counter whose clock input is fed by the other gate and a digital to analog converter in the form of a resistance network, fed by the parallel outputs of the counter and delivering a staircase voltage wave while this other gate is enabled.

BRIEF DESCRIPTION OF THE DRAWINGS

The invention will be better understood and other of its objects, characteristics and advantages will be clear from the following description and accompanying drawings, which are given by way of example, and in which:

FIG. 1 is a front view of a first embodiment of the facade or front face of the inoperative receiver in accordance with the invention.

FIG. 2 is a perspective view of the case of the receiver showing a second embodiment of the facade when it is in the operating state; and FIG. 3 is a schematic diagram of one embodiment of the entirely electronic control device for such a "car radio" receiver.

DESCRIPTION OF THE PREFERRED EMBODIMENT

In FIG. 1 there is shown at 1 the facade or front face of the "car radio" receiver which is mounted on the dashboard of the motor vehicle so that it is substantially flush with the surface of this dashboard or, possibly, placed in a shallow cavity thereof. In this embodiment, it is surrounded by a rectangular frame 2 which serves for retaining the facade 1 in position, for example, by means of a groove (not shown) formed in its inner periphery. The rear of frame 2 is firmly secured to the circumference of the parallelepipedic shaped metal case (not shown) of the receiver.

It may be advantageous to form frame 2 from a plastic material having a certain elasticity for relatively easy removal from facade 1, which, by uncovering the front face (not shown) of the case of the receiver, covered thereby, allows any incandescent signalling and lighting lamp to be replaced.

The facade 1 forms the front face of a rigid rectangular plate 3 made from a tinted insulating material, that is to say from a transparent plastic (resin) material in which is mixed a dye of a relatively dark tint. This attenuates the light coming from the above-mentioned lamps so that the driver is not disturbed or dazzled and gives it an opaque appearance when it is solely illuminated from the outside. The transparent material used is, preferably, an acrylic resin such as polymethyl methacrylate.

In the right-hand lower corner, the facade 1 may bear the mark of the manufacturer or of the distributor 4 which may be obtained, for example, by metalizing or painting the front face or the rear face of the tinted plate. In the second case, it must be lit up from behind to become visible.

In FIG. 1, there is shown in broken lines four sensitive zones or proximity effect or capacitive coupling keys designated respectively by 5, 6, 7 and 8. At the location of the sensitive zones 5–8, the thickness of plate 3 must be reduced by hollows (cavities) formed preferably in its rear face and, possibly, in its front face or in both, either during casting or molding of the part or subsequently by machining.

The four sensitive zones or keys 5–8 (sunken) shown have a substantially square shape end are spaced apart equidistantly along an axis parallel to the longitudinal axis of the rectangular plate 3. They may also be rectangular, circular or elliptic, or have any other geometrical shape.

The respective rear faces of these thinned down zones are metallized that is to say each covered over the major part of its surface with a metal layer which, if it is opaque, comprises several gaps in the form of symbols (+,−), or letters (R,A) so that they are made visible by backlighting, provided by lamps disposed behind these zones which are moreover defined by opaque dividing walls projecting from the front face of the case so that each one illuminates only a single key. These letters and symbols indicate the functions (stop, search, reduction or increase of the sound volume) which each of the keys 5 to 8 controls. The metalized surfaces are insulated from each other.

When the metallization is transparent, the zones which are not intended to be illuminated by transparence may be covered with an opaque paint layer. In this case, it is possible to light up the sensitive zone as a whole and the symbol or letter indicating the function may be opaque.

In FIG. 2, there is shown in perspective the parallelepipedic case 9 containing the reception and control circuits whose front face is covered with a rectangular plate 3 according to a second embodiment of the invention.

The rear, bottom top and side walls of case 9 are made from a conducting metal (metal sheet) so as to form a screen against spurious signals coming from the ignition and/or other interference from inside or outside the vehicle. It may be advantageous to provide it with a removable metal cover 10a for allowing access to the electronic circuits for possible repairing thereof.

Plate 3 is provided over the upper part of its front face with two super posed display zones 10 and 11 having respectively graduations (vertical lines) and aligned numbers, as well as at the end of each line thereof, the indication of the units (MHz and kHz) relating to these numbers. On the side opposite that of the units, each display zone comprises a designation of the wave range received (LW,MW or AM and FM). These indications (graduations, figures and letters) may be displayed by contrast with their environment, the former being opaque and the latter transparent and colored or viceversa. The two display zones 10 and 11 are defined inwardly by opaque projections so that they are illuminated alternately depending on the wave-range received. In the space between these display zones 10 and 11 is inserted a linear ramp formed by (sixteen) juxtaposed electroluminescent or light-emitting diodes (LED) 12 which indicate approximately, for example, by the number of adjacent diodes illuminated, that is to say by the length of the visible line that they form, the tuning frequency of the input or radio-frequency circuit of the receiver. These light-emitting diodes are only available in certain colors, it is then preferably to choose the same color for the dye of the plate 3 so as not to attenuate too much the light emitted thereby.

In one of the upper corners of plate 3 (here on the left-hand side), it is possible to represent by means of a double seven-segment display 13 symbols for identifying certain popular broadcasting stations or the waverange received. These stations are characterized by their respective broadcasting frequencies, so the tuning voltage may be compared analogically with a reference voltage proper to each station, or the digital indication supplied by a frequency or tuning voltage synthesizer which will be described further on, may be used, by comparing some of the most significant digits thereof with those of a stored number corresponding to the station or by using a decoder/demultiplexer. Plate 3 may be firmly interlocked with the front periphery of case 9 by bonding for example. In this case, the front face of this latter which carries the signalling and lighting lamp sockets, the linear ramp of light-emitting diodes 12 and the double display 13 is integral with the chassis (not shown) which should be removable from the rear. The electrical connection between the metalized zones of keys 5 to 8 and the electronic circuits carried by the chassis may then be formed by means of spring blade contacts.

FIG. 3 is the schematic diagram of an embodiment of an entirely electronic control device of the "car radio" receiver according to the invention. In this device, each of the sensitive (proximity effect) keys 5, 6, 7 and 8 is connected to the control input of an oscillator 15, 16, 17 and 18, the first of which is shown schematically.

The receiver comprises a positive supply terminal 19 which is connected to the positive pole of the battery B whose negative pole is connected to the metal chassis of the vehicle, forming ground. This positive supply terminal 19 is connected through a resistor 20 to the positive supply input of oscillator 15, this positive supply input being coupled to its negative supply input, which is grounded, through a capacitor 21 which forms a decoupling circuit with the resistor 20.

The positive supply input of oscillator 15 is further connected, through a parallel resistor 150 and capacitor 151 circuit to the emitter of a PNP type bipolar transistor 152 and through a resistor 153 to the base thereof. This base is further connected through a resistor 154 to the negative supply input of oscillator 15, to which is also connected the collector of transistor 152 through a parallel resonant circuit formed by an inductance 155 and a capacitor 156. This inductance 155 is tightly magnetically coupled to a feedback winding 157 one of whose terminals is connected to the base of transistor 152 and whose other terminal is connected to the control input 158 of oscillator 15. This control input 158 is connected to the metallized zone of the rear face of plate 3 which forms the key 5 designated by the latter "A" (indicating "stop").

Resistors 153 and 154, connected in series between the positive and negative supply inputs of oscillator 15, bias the base of the PNP transistor 152 so that it is permanently turned on.

Since key 5 is insulated from the rest of the circuit, winding 157 supplies no current to the base of transistor 152. This latter starts being oscillating only when a part of the body of the user, such as a hand or a finger, becomes capacitively coupled to the metallized zone 5 by coming sufficiently close thereto. The feedback then becomes sufficient for the oscillator to begin to oscillate and to supply at its output 159, formed by the collector of transistor 152, a voltage wave having a frequency determined by the values of inductance 155 and capacitor 156 forming the resonant collector circuit thereof. This frequency is, for example, chose in the ultrasonic frequency range. This oscillation continues until the part of the body is removed sufficiently far away from key 5.

The output 159 of oscillator 15 is connected to the input of a rectifier circuit 25 comprising a diode 25 whose anode forms the input and whose cathode the output of this circuit 25. This cathode is furthermore connected to ground through a circuit formed of a parallel-connected resistor 251 and capacitor 252 whose time constant (RC) is chosen greater than three times the period of the wave delivered by oscillator 15. The rectifier circuit 25 then delivers, in response to a wave train of limited duration corresponding to that of activation of key 5, a positive rectangular signal of substantially the same duration, whose rise and fall times are determined by this time constant.

The output of the detector circuit 25 is connected to the input of a first wired logic inverter stage 22, i.e. formed of discrete elements. This input is connected through a series resistor 220 to the base of an NPN type bipolar transistor 221 whose emitter is grounded. This resistor 220 limits the base current of this transistor 221 and thus the load connected to the terminals of the LC resonant circuit 155-156 of oscillator 15 during the positive half periods of its oscillation. It is however advantageous to connect a capacitor 222 between the base and the emitter of transistor 221, which results in further increasing the rise and fall times of the pulses whose leading and trailing edges it moreover delays. The collector of transistor 221, which forms the output of this inverter stage 222, is connected through a resistor 223 to the positive output of an integrated voltage regulator 24 whose positive input is connected to the positive supply terminal 19 of the receiver. The negative input and output of this regulator 24 are both grounded.

It will be noted here that the voltage regulator 24 whose positive input and output are moreover respectively decoupled to ground through two capacitors 29 and 30, is intended to supply the whole of the electronic control device of the receiver with the exception of oscillators 15 to 18, the supply switch and its transistorized control stage. Since its input voltage is that of the battery B (12 V), its output voltage is chosen, more especially, with a view to supplying with power the integrated logic circuits (for example, of 5 volts) which it comprises. In order to keep the current consumption during standby of the integrated (digital logic circuit) is as low as possible, those of the type generally called "CMOS" are preferably chosen; this abbreviation of American origin means that they are essentially formed from insulated gate field effect transistors (MOS), with complementary symmetry.

The output of the inverter stage 22, that is to say the collector of the NPN transistor 221, is connected to the clock input T of a "JK" type flip-flop 31 comprising an asynchronous reset input R and inputs designated by J and K which are respectively coupled (relooped) to its complementary output $\overline{Q}$ and to its output Q. This latter is further connected to the base of an NPN type bipolar transistor 32 through a base current limiting resistor 33. The emitter of this transistor 32 is connected to ground and its collector is connected to the positive supply terminal 19 through a resistor 34 and to the base of another NPN bipolar transistor 35 whose collector is also connected to terminal 19 and whose emitter is connected to the positive output supply terminal 36 which supplies various other circuits of the receiver as well as the signalling and lighting lamps thereof. The supply switch is thus formed by transistor 35 which must be capable of conducting in the saturated state a current of high intensity and resistor 34, which is at the same time the resistor for biasing the base of transistor 35, and the collector resistor of transistor 32 forms with this latter the control stage of this switch.

When the "JK" flip-flop 31 is in the high state (or "one"), its Q output supplies substantially the output voltage of the regulator 24 which supplies it so that the control transistor 32 is saturated and consequently the switch transistor 35 is turned off. The receiver is then inoperative and none of the lamps for illuminating its facade 1 from behind is lit, this latter then presenting an opaque appearance because plate 3 is tinted.

When a hand or finger of the user then draws near the first sensitive zone 5, oscillator 15 begins to oscillate and rectifier 25 delivers a positive rectangular signal causing saturation of transistor 221 of the inverter stage 22, whose collector then supplies to the clock input T of the "JK" flip-flop 31 a low state (or "zero"). Because of the respective relooping of the Q and $\overline{Q}$ outputs to the J and K inputs these latter have respectively received during the high state previously applied to input T, a low state and a high state. The transistion between the high state and the low state at input T causes flip-flop 31 to switch to its low or zero state (appearing at the Q output)

which causes the control transistor 32 to be turned off so that the switch transistor 33 biased at its base by resistor 34 becomes saturated and supplies the receiver some of whose lamps light up, particularly those lighting the sensitive keys 5 to 8.

The other sensitive keys 6, 7 and 8 are also respectively connected to the control inputs of other associated oscillators 16, 17 and 18 similar to the first one 15, whose outputs feed respectively rectifier circuits 26, 27 and 28, also similar to the first one 25.

According to one embodiment of the invention, the outputs of the other rectifier circuits 26 to 28 are respectively connected to three inputs of a wired "OR" circuit 37 comprising three diodes 38, 39 and 40 whose cathodes, connected together, form the output thereof. This output of the "OR" circuit 37 is connected to the base of a PNP bipolar transistor 41 through a resistor 42. This base is further connected to ground through another resistor 43. The collector of transistor 41 is connected to ground and its emitter is on the one hand connected to the reset input R of the "JK" flip-flop 31 and, on the other hand, to the output of the voltage regulator 24 through a resistor 44. The stage formed of elements 42 to 44 forms a non-inverting buffer stage.

When none of the other sensitive keys 6, 7 and 8 is activated by the proximity of a part of the body of the user, transistor 41 is saturated because its base is connected to its collector through the resistor 43. The reset input R of flip-flop 31 then receives a low state which has no influence on its switching by signals applied to its other inputs T, J and K. On the other hand, when one or more other keys 6 to 8 are activated, one or more other rectifier circuits 26 to 28 supply positive rectangular signals which enable one or more diodes 38 to 40 of the "OR" circuit 37 so as to cause a current to flow through the series resistors 42 and 43. If the amplitude of the wave supplied by at least one of the other oscillators 16 to 18 is such that the amplitude of the rectangular signal supplied by one of the other rectifier circuits 26 to 28 exceeds the regulated voltage provided by regulator 24 multiplied by the inverse of the division ratio of the voltage divider formed by the series resistors 42 and 43, transistor 41 is turned off and the reset input R receives temporarily a high state. This forms a rectangular signal applied to the input R which causes flip-flop 31 to be reset, if it was not already there. As before, the zero state at the Q output causes transistor 32 to be turned off and transistor 35 to be saturated.

This arrangement comprising the "OR" circuit 37, transistors 41 and resistors 42 to 44 allows switching on of the receiver to be controlled by activation of any sensitive key 5 to 8 or of several of them and then the desired function (station search, volume control range switching) to be controlled by activating the appropriate key which are then all made visible by illumination from behind.

When the "JK" flip-flop 31 is in the zero state which controls the power supply of the receiver through the output terminal 36 of the control device of FIG. 3, activation of the first sensitive key 5 designated by the symbol "A" signifying "Off", causes resetting thereof to the high state. During the above-mentioned zero state, the input J connected to the complementary output $\overline{Q}$ and the clock input T connected to the junction between resistor 223 and the collector of transistor 221 receive respectively high states. Activation of the key "A" 5 causes oscillator 15 to start oscillating and a positive rectangular signal to be supplied to the output of the rectifier circuit 25 for controlling saturation of transistor 221. The clock input T is then temporarily grounded and controls the switching of flip-flop 31 to its high state which in its turn causes the control transistor 32 to be saturated and the switch transistor 35 to be turned off. The circuits of the receiver except for the control device are then no longer supplied with power and the signalling and lighting lamps also go out so that facade 1 resumes its opaque appearance.

The automatic search function for broadcasting stations is controlled by the second sensitive key 6 designated by the symbol "R". Activation thereof establishes the feedback of the second oscillator 16 whose output wave rectified by the second rectifier circuit 26 forms a positive rectangular signal. The output of the second rectifier circuit 26 is connected to the input of a second inverter 45 similar to the first one 22, which comprises a NPN bipolar transistor 450 whose base is connected through a current limiting resistor 451 to this output, whose emitter is grounded and whose collector is connected through a collector resistor 452 to the output of the voltage regulator 24.

The collector of transistor 450 is further connected to a low state set input $\overline{S}$ of a first RS bistable latch formed of two NAND gates 460 and 461 which are cross coupled. The output of the first NAND gate 460 is connected to one of the inputs of the second one 461 whose other input forms the low state reset input $\overline{R}$. The output of the second gate 461 is connected to that one of the inputs of the first gate 460 which is not connected to the collector of transistor 450. The outputs of the two NAND gates 460 and 461 form respectively the Q output and the complementary $\overline{Q}$ output of latch 46.

During the standby state of the receiver, where it is only the electronic control device which is supplied with power, the $\overline{S}$ input receives a high state through resistor 452 and the $\overline{R}$ input connected to an element 47 (shown with a broken line) of the receiver, supplied by terminal 36 which is insulated by the turned off switch transistor 35, receives a low state. Consequently, the first RS latch 46 is at the zero state, that is to say that its Q output supplies a low state and its complementary $\overline{Q}$ output a high state. After switching on of the receiver by activating any one of keys 5 to 8, element 47 supplied with power through terminal 36 also delivers a high state to input $\overline{R}$ which has no effect on the state of the RS latch 46.

Activation of the second key ("R") 6 causes, in the way described above in connection with the first one 5, temporary saturation of transistor 450 which thus supplies a low state to the $\overline{S}$ input of the first RS latch 46 so that the first gate 460 then supplies a high state causing the output of the second gate 461 to pass to the low state. In first RS latch 46 is then in its high state (Q=1, $\overline{Q}$=0).

It should be noted here that it is also possible to form an RS bistable latch by means of two cross-coupled NOR gates, whose switching is then controlled by high states. The Q output of the first RS latch 46 is connected to one of the inputs of another NAND gate 48 whose other input is connected to the output of a first astable multivibrator 49 delivering square or rectangular signals (pulses) at a first predetermined frequency.

It should be noted here that the first astable multivibrator 49 is preferably formed from several integrated logic inverters or gates of the same type ("CMOS") as the other digital circuits which the control device comprises. In FIG. 3, it has been shown comprising three ring connected inverters formed from three NAND gates, each of which has all its inputs connected in parallel and one of which comprises a feedback capacitor connecting its output to its input and which makes it an integrator stage. The integrator provides a triangular waveform which, applied to the next stage, uses the switching threshold thereof to supply recurrent rectangular signals, whose frequency depends on the capacity of the capacitor. An astable multivibrator formed by a ring of three inverters has been described in the article by Faldman appearing on page 59 of the U.S. review Electronics of Aug. 2, 1971.

When one of the inputs of the NAND gate 48 receives from latch 46 a high state and its other input receives from the multivibrator 49 a pulse or square wave sigal, it delivers at its output connected to the clock input H of a first binary counter 50, a complementary signal (in phase opposition) with respect to the one at the input. Counter 50 is of the type in which each stage ("JK" flip-flop) comprises a parallel output (Qo . . . Qn). It may be formed from several four-bit binary counters connected in cascade, that is to say that the parallel output of the last stage (O3) of the preceding counter is connected to the clock input of the following counter. The respective asynchronous reset inputs of these cascade counters are connected in parallel and, possibly, connected to a signal source for resetting which would occur whenever the receiver was stopped (or started up) or to ground (a 12 bit CMOS counter is of the 4040 type, for example).

The parallel outputs of counter 50 are respectively connected, possibly through separator or buffer stages, to the inputs of a digital-to-analog converter 51, such as a so-called "ladder" or "R-2R" resistance network, which is well known. The output of the converter network 51 delivers at the output 52 of the control device, possibly decoupled to ground through a capacitor 53, a staircase shaped voltage wave which varies by a step at each pulse applied to the clock input H of counter 50. The magnitude of this step depends, on the one hand, on the number of stages of counter 50 and, on the other, on the supply voltage thereof (or on that of the buffers). This output voltage which forms the tuning voltage reversely biasing the variable capacitance diodes of the tunable resonant circuits of the receiver, will then vary gradually between a low positive value close to zero and substantially this supply voltage of counter 50 or of the multiple buffer if such be the case. The assembly formed by the multivibrator 49, counter 50 and converter network 51 forms a simplified voltage synthesizer which forms the automatic search circuit of the receiver.

It should be noted here that the variable capacitance diodes must, especially in so far as the reception of long waves are connected (from 150 to 300 kilohertz), form capacities going from a few tens of picofarads to about 500 pF (such as those of the type BB212, for example), for tuning voltages varying between a few hundredths and ten volts.

Stopping of the search is controlled automatically by a negative rectangular signal (pulse) delivered by element 47 of the receiver to the low state reset input $\bar{R}$ of the first RS latch 46. This element 47 is connected, on the one hand, to the automatic gain control circuit (AGC) to receive therefrom a positive transition, when the local oscillator supplies a frequency which allows an amplitude modulated carrier wave to be picked up (in the long or medium wave range) and, on the other hand, to the automatic frequency control circuit (AFC) which also supplies a positive transition when the local oscillator has tuned in to a frequency modulated carrier. It further comprises a stage such as a monostable flip-flop capable of supplying, in response to this positive transition, a negative pulse whose leading edge is formed by a transition between a high state and a low state and whose trailing edge is a transition complementary to the preceding one. This negative pulse controls the resetting of RS latch 46 so that gate 48 one input of which is connected to the Q output of this latter and whose other input is connected to the output of multivibrator 49 permanently supplies a high state which stops the count of counter 50 and, consequently, the automatic search. By picking up or tuning in, there will be understood here the reception of a carrier wave with an amplitude sufficient to cause operation of the AGC or AFC circuits of the receiver.

If the program received then does not correspond to the one desired by the listener, it is sufficient to reactivate the second sensitive key 6 ("R") to start up again the automatic search which will again stop once a carrier of an adjacent lower frequency is picked up by the receiver. It is thus possible to go through the frequency range from top to bottom and to begin again at the top when the number of pulses counted has exceeded by a unity the capacity of counter 50, for it then supplies zeros at all its parallel outputs.

To signal popular stations by means of a double seven-segment display, some parallel outputs of the counter 50 (or of a multiple buffer supplied thereby) may be connected to decoders formed from AND or NAND gates which are combined together, so that each of them supplies a high state for a predetermined binary word applied to its inputs and a low state in response to all the others. This high state may control a double alphanumeric character generator whose outputs are connected in a known way to the double seven-segment display. With each binary word corresponding to a carrier frequency of a broadcasting station, the double display supplies the light symbol of this latter by means of two predetermined letters or a letter and a number or any other symbol, when the counter 50 stops on this number.

The other two sensitive keys 7 and 8 have a dual function, on the one hand when the automatic search is stopped, to increase or reduce the sound volume and, on the other hand, during searching, to switch the frequency ranges between the long waves (LW) or medium waves (MW or AM) and frequency modulation (FM) or the VHF band (from 88 to 108 MHz).

For range switching during automatic searching, the Q output of the first RS latch 46 is connected to respective first inputs of two NAND gates 54 and 55 with two inputs whose second inputs are respectively connected to the outputs of the third 27 and fourth 28 rectifier circuits. The output of the first one 54 of these two gates 54, 55 is connected to the set input $\bar{S}$ of a second RS bistable latch 56, similar to the first one 46, formed of two cross-coupled NAND gates. The output of the second one 55 of these gates 54,55 is connected to the reset input $\bar{R}$ of the second RS latch 56. The Q output of this latter is connected to the input controlling the range switching 57 of the receiver, which controls electronic switches (with diodes for example).

When the third sensitive key 7 designated by the symbol "+" is activated during the high state of the first RS latch 46, the third rectifier circuit 27 which is associated therewith supplies a positive rectangular signal, in response to which gate 57 delivers a negative pulse which corresponds to the temporary application of a low state to input $\bar{S}$.

This latter controls the setting to "one" of the second RS latch 56 whose Q output delivers a high state controlling the range switch so that the tunable resonant circuits of the receiver operate in the VHF band and so that the input of the low (or audio-) frequency amplifier is connected to the frequency discriminator or demodulator.

When, under these conditions, the fourth sensitive key 8 designated by the symbol "−" is activated, the fourth rectifier circuit 28 supplies a signal which causes the output of gate 55 connected to the $\bar{R}$ input of the second RS latch 56 to pass temporarily to the low state thus causing resetting of this latter. Its Q output then supplying a low state which controls the switching of the tunable resonant circuits so that they may receive signals in the long or medium wave (LW or AM) range and of the input of the low frequency amplifier so that it is connected to the envelope detector or amplitude demodulator.

When resetting of the first RS latch 46 causes the search to be stopped by applying a low state to one of the inputs of NAND gate 48, this low state is also applied to the respective first inputs of the two NAND gates 54 and 55 whose respective outputs then permanently supply high states whatever the signal received by their second inputs. The second RS latch 56 is thus maintained in the state which it had prior to resetting of the first one 46 and it can only change state after resumption of the automatic search.

The zero state of the first RS latch 46 allows, on the other hand, the sound volume to be controlled by activation of one or other of the sensitive keys 7 ("+") and 8 ("−"). To this end, the complementary $\bar{Q}$ output which then delivers a high state, is here connected to one of the inputs of a three-input NAND gate 58 whose other two inputs are respectively connected to the outputs of two other NAND gates 59 and 60 having two inputs each. The first inputs of gates 59 and 60 are respectively connected to the outputs of the third 27 and fourth 28 rectifier circuits which are respectively associated with keys "+", 7 and "−", 8. The second respective inputs of gates 59 and 60 are connected in parallel to the output of an integrator stage comprising an integrated logic inverter stage formed from an NAND gate 61 all of whose inputs are connected in parallel, and a feedback capacitor 62 connecting the output of inverter 61 to its input. The assembly thus formed constitutes a second astable multivibrator 63 with a selective routing function on two outputs 64 and 65, controlled by the latter two sensitive keys 7 and 8.

More precisely, when the first RS latch 46 is in the zero state and its complementary $\bar{Q}$ output applies a high state to one of the three inputs of gate 58 which also receives, outside the periods of activation of one of keys 7 and 8, high states on its other inputs, the output of this gate 58 supplies a zero to the input of inverter 61. The output of inverter 61 connected to one of the plates of capacitor 62 whose other plate is then grounded, ensures gradual charging thereof from the time when the gate 58 begins to supply a low state, until this output reaches a high state. This increasing voltage is applied in parallel to the second respective inputs of both gates 59 and 60 until a switching threshold is exceeded. From this threshold, when activation of key "+" 7 causes a high state to be applied to the first input of gate 59 or that of key "−" 8 causes the same thing in so far as gate 60 is concerned, they become capable of supplying a low state. This activation of one of keys 7,8 establishes then a feedback path by causing a low state coming from the outputs of one of gates 59,60 to be applied to one of the inputs of gate 58 whose output passes to the high state which results in discharging capacitor 62 so that the output of inverter 61 then supplies a gradually decreasing voltage. This latter is applied in parallel to the second inputs of gates 59,60 one of which (59 or 60) receives at its first input a high state from one of the rectifier circuits 27,28. As soon as the decreasing voltage has become less than another switching threshold (less than the preceding one because of hysteresis), the output of this gate (59 or 60) provides a high state which causes that of gate 58 to pass to the low state which in its turn causes recharging of capacitor 62.

Thus it is provided, during the period of activation of one of keys 7 or 8, for monostable multivibrator 63 to operate and supply at one of its outputs 64 and 65 connected respectively to those of gates 59 and 60, periodic signals of a substantially square shape. Output 64 is then associated with key "+" 7 and output 65 with key "−" 8, after the automatic search device (49-50-51) has been stopped on a tuning voltage corresponding to a broadcasting station, by resetting of the first RS latch 46.

It will be noted here that circuit 63 may be formed from an astable multivibrator with three ring logic inverters (see element 49) one of whose inverters is replaced by NAND gate having two inputs one of which is connected to the output of the upstream inverter and the other of which is connected to the complementary $\bar{Q}$ of the first RS latch 46. This multivibrator would then operate whenever the search device stops on a transmitting station. The routing may then be provided by two other NAND gates whose first inputs would be connected in parallel to the output of this astable multivibrator and whose second inputs would be resepectively connected to the third 27 and fourth 28 rectifier circuit. Such a circuit would comprise an additional inverter element or gate.

The outputs 64 and 65 of circuit 63 are connected respectively to the up-counting U and down-counting D inputs of a snychronous binary up-and-down counter 66 with two clock inputs (U and D), which further comprises as many asynchronous data inputs (not shown) and parallel outputs (Qo . . . Qn) as stages (JK flip-flops), as well as respective load input L and reset R inputs and respective borrow B and carry C outputs. The data inputs are here connected to ground and the load L and reset R inputs are connected together to the borrow output B.

The parallel outputs of the up-and-down counter 66 are connected to the parallel inputs of a second ladder converter "R-2R" network 67 (of similar type as the first one 51) whose output connected to the control input of the sound volume 68 (possibly decoupled through a capacitor 69), supplies a staircase voltage, increasing when the square waves are supplied to the up-count (U) input or decreasing when it is the down-count (D) input which receives them.

By using a four-stage binary up-down counter, each voltage increment (or decrement) is substantially equal to a sixteenth of the supply voltage thereof. It is possible to connect in cascade several of these up-down counters in a conventional way to reduce the increment. It is then necessary to increase the frequency of the second astable multivibrator 63 by reducing the capacity of capacitor 62.

The voltage supplied by the output of the converter network 67 to the volume control input 68 must be applied to the control input of an element whose gain is controllable by a voltage. Such an element (not shown) may be formed by a potentiometric circuit (a resistive voltage divider with variable division factor) comprising one or more resistors whose value varies as a function of a DC voltage. Such a variable resistance may be formed by one or more insulated gate field effect transistors (IGFET or MOSFET).

It should be noted here that, in order to facilitate use of the dual function keys 7 and 8, the two functions of each of them may be indicated by transparency by means of two symbols or abbreviations disposed respectively in two diagonally opposite quadrants of the key and illuminated by two separate lamps controlled respectively by signals present at the Q and $\overline{Q}$ outputs of the first RS latch 46. Thus, it is possible to add the abbreviation FM (frequency modulation) in the lower left-hand corner of key 7 and the abbreviation LW (long wave) in that of key 8. During the period of automatic search, it is the lamps lighting up respectively the symbols FM and LW which are lighted and when this search is stopped, it is those illuminating symbols "+" and "−" which light up to allow the user to ascertain that he is receiving a transmitting station even when the sound is absent (volume adjusted to the minimum).

The tuning indicator is formed by the light-emitting diode ramp (12 of FIG. 2) which comprises sixteen in alignment. These diodes are respectively connected to the sixteen outputs of a four to sixteen channel decoder/demultiplexer (not shown) (such as type 54154 or 74154 in TTL). The four inputs of this decoder are connected respectively to the four parallel outputs of counter 50 which supply the four most significant digits of the output word thereof.

In one of the embodiments of the receiver, the dual seven-segment display (13 in FIG. 2) is also controlled from words supplied by these four parallel outputs supplying the most significant digits, which are either decoded, or compared with stored four-bit words corresponding to frequencies close to those of popular stations in the long wave range. When a decoder/demultiplexer provides an active state at one of the chosen outputs and the Q output of the second RS latch 56 indicates that the long wave range is being received (by a zero), two generators of previously chosen alphanumeric characters are activated so as to display two light symbols. If none of these outputs is active, a double character generator causes the symbol "LW" to be displayed. For frequency modulation, another double character generator controlled by the high state at the Q output of the second RS latch 56 causes the symbol "FM" to be displayed. The output state of this latch 56 also controls the alternate lighting of zones 10 and 11 of FIG. 1.

The invention is in no wise limited to the abovedescribed embodiments, but it comprises all the technical equivalents able to fulfil the same functions by other means known per se. It is, for example, possible to replace the second RS latch 56 controlling range switching by a JK flip-flop cross-coupled and controlled at its clock input T by an additional key. The bipolar transistors may, on the other hand, be replaced by field effect transistors and certain NAND gates by AND gates. It is also possible to modify the combined multivibrator-routing circuit 63 by replacing the two dual input gates 59 and 60 by two three-input gates each of which would have an additional input connected to the complementary $\overline{Q}$ output of the first RS latch 46 and by replacing the first three-input gate 58 by one with two inputs which would be connected respectively to outputs 64 and 65 and the second three-input gate 61 by an inverter or another gate with two inputs connected in parallel.

What is claimed is:

1. A radio receiver free of control knobs and mechanical switches, which displays control information when operated and marks the information when not operated thereby disguising the identity of the receiver as such when not operated, the receiver comprising:
    a receiver housing mounting a substantially planar front plate thereto which is tinted and light transmissive, said plate being free of any observable portions construable as enabling control of said receiver;
    a plurality of control areas located at the rear of the plate for sensing touch of said plate and causing change in a respective plurality of control functions of the receiver thus altering its operation;
    first light source means located at the rear of the front plate for displaying operating frequency information only when the receiver is operated; and
    second light source means located at the rear of the front plate for back-lighting the control areas only when the receiver is operated.

2. A receiver set forth in claim 1 together with control means connected to one of the control areas for switching the receiver on and off.

3. A receiver set forth in claim 1 wherein the front plate is made from a plastic insulating material.

4. A receiver set forth in claim 1 wherein each control area comprises:
    a first section permitting light transmission only when the second light source means is turned on and defining a symbol corresponding to a respective control function; and
    a second section surrounding the first section and permitting less light transmission when the second light source means is turned on thereby increasing the readability of the symbol.

5. A receiver set forth in claim 1 together with:
    a first control device cooperating with a corresponding control area for effecting receiver frequency scanning;
    second and third control devices cooperating with corresponding control areas for raising and lowering receiver volume; and
    a fourth control device cooperating with a corresponding control area for switching the receiver on and off.

6. A receiver set forth in claim 1 together with a plurality of oscillators corresponding in number to the control areas, and switch means respectively connected to the oscillators for switching on particular control functions when the front plate is touched in the vicinity of a selected control area.

7. A receiver according to claim 1 wherein the first light source means comprises a line of LEDs and means for lighting a progressing number of the LEDs as a tuned frequency of the receiver increases, the color of the LEDs being transmitted through the front plate.

8. A receiver as set forth in claim 3 wherein the plastic insulating material is an acrylic resin mixed with a preselected dye.

9. A receiver set forth in claim 4 wherein the section of a control area permitting less light transmission is covered with a metal layer deposited on the rear face of the front plate.

10. A receiver as claimed in claim 6 wherein each oscillator, which is of the tuned collector type, comprises a feedback winding magnetically coupled to the inductance of a parallel resonant circuit therein, one terminal of which winding being connected to the base of a common emitter connected transistor, which is biased so that it conducts permanently and whose other terminal is connected to a metal layer of an associated control area, so that feedback may be established by capacitive couplingAof a user with said metal layer.

11. A receiver as claimed in claim 6, wherein the output of each oscillator is connected to the input of a respective rectifier circuit rectifying the positive peaks of the wave supplied by the oscillator and which delivers in response thereto a positive signal whose duration corresponds to the duration of a user's touch of said front plate in the vicinity of a control area.

12. A receiver as claimed in claim 9, wherein said metal layer forms an electrode of a capacitor, the control area operating as a capacitive proximity effect key when the front plate is touched.

13. A receiver as claimed in claim 11, wherein the output of a first rectifier circuit associated with a first control area is coupled through a first inverter stage to the clock input of a "JK" bistable flip-flop whose complementary outputs are respectively cross-looped to its control inputs so that each temporary application of a low state to its clock input, controls switching thereof and wherein the output of said flip-flop is connected to the base of a control transistor whose emitter is connected to ground and whose collector is connected to the base of a switch transistor whose collector-emitter path is inserted between the positive pole of a battery and a supply input terminal of the receiver, the junction between the collector of the control transistor and the base of the switch transistor being further connected to the collector of the switch transistor through a resistor which serves both as collector resistor for the control resistor and as base biasing resistor for the switch transistor so that, when one is saturated, the other is disabled, so that the first control area may control either the switching on or off of the receiver through said terminal.

14. A receiver as claimed in claim 11, wherein the output of a second rectifier circuit associated with a second control area, which controls receiver scanning, is connected, through a second inverter, to the set input of a first "RS" bistable latch whose Q output connected to a first coincidence gate allows, when it supplies a high state, transmission of a periodic clock signal from an astable multivibrator to the counting or clock input of a first binary counter whose parallel outputs supply a digital-analog converter network supplying at its output, for the duration of this clock signal transmission, a staircase voltage waveform which is applied to variable capacity diodes contained in tunable resonating circuits of the receiver, in order to effect frequency scanning, and wherein the output of a receiver circuit, in response to a received carrier of sufficient amplitude, supplies a pulse to the reset input of the first "RS" latch, capable of causing it to switch so that it prevents the transmission of the clock signal through the first gate and so that scanning stops on a station.

15. A receiver as claimed in claim 13, wherein the outputs of other rectifier circuits are connected respectively to the input of a wired "OR" gate whose output is connected through a transistor stage to the reset input of the "JK" flip-flop, normally maintained in the zero state and which, in response to activation of one or more other keys, passes temporarily to the high state so as to control, through the resetting of said flip-flop, the switching on of the receiver.

16. A receiver as claimed in claim 14, wherein the pulse applied to the reset input of the first "RS" latch is generated from a signal coming either from an AGC circuit of the receiver, when the carrier received is amplitude modulated or from an AFC circuit, when it is frequency modulated.

17. A receiver as claimed in claim 14, further comprising:
a second astable multivibrator including routing means and two coincidence gates with control inputs, the outputs of said two coincidence gates being connected respectively to the up-counting and down-counting inputs of a synchronous binary up-down counter feeding by its parallel outputs a second digital-analog converter network, the control inputs of the coincidence gates being respectively connected to two other rectifying circuits each of which is associated with one of two other control areas, the output of the second converter network then supplying increasing staircase voltage waveforms when the routing means controlled via one of said multivibrator coincidence gates by a respective control area supplies the up-counting input or decreasing when, controlled by another control area, it supplies the down-counting output, the output voltage of the second network controlling a variable gain element as a function of its level, to vary sound volume.

18. A receiver as claimed in claim 14, wherein those of the parallel outputs of the first binary counter which supplies the four most significant digits are further respectively coupled to a decoder-demultiplexer having four inputs and sixteen outputs which are connected respectively to sixteen light-emitting diodes forming a tuning indicating line.

19. A receiver as claimed in claim 16, further comprising a second "RS" bistable latch whose set input is coupled to the output of a third rectifier circuit associated with a third control area and whose reset input is coupled to the output of a fourth rectifier circuit associated with a fourth control area, one or the other of the respectively complementary outputs Q, Q̄ of the second RS latch controllng switching of the frequency ranges.

20. A receiver as claimed in claim 18, wherein those of the parallel outputs of the first binary counter which supply the four most significant digits are further connected to one or more other decoders whose different outputs each control two alphanumeric character generators which control respectively two seven-segment juxtaposed displays indicating the frequency range or the reception of popular stations in the long wave range, by means of predetermined symbols.

21. A receiver as claimed in claim 19, further comprising a second and a third coincidence gate each of which has one input connected to the output of said first "RS" bistable latch, whose other inputs are connected respectively to the outputs of the third and of the fourth rectifier circuits and whose outputs are connected respectively to the set and reset inputs of said second "RS" bistable latch, so that they allow control of the range switching solely during the period when scanning takes place, so as to allow use of the third and fourth control areas for controlling other functions outside this period.

* * * * *